(12) United States Patent
Burssens et al.

(10) Patent No.: US 11,047,926 B2
(45) Date of Patent: Jun. 29, 2021

(54) MAGNETIC SENSOR

(71) Applicant: MELEXIS TECHNOLOGIES SA, Bevaix (CH)

(72) Inventors: Jan-Willem Burssens, Bevaix (CH); Vincent Hiligsmann, Bevaix (CH); Lucian Barbut, Bevaix (CH); Samuel Huber Lindenberger, Bevaix (CH); Christian Schott, Bevaix (CH)

(73) Assignee: Melexis Technologies SA, Bevaix (CH)

( * ) Notice: Subject to any disclaimer, the term of this patent is extended or adjusted under 35 U.S.C. 154(b) by 59 days.

(21) Appl. No.: 16/470,396

(22) PCT Filed: Dec. 14, 2017

(86) PCT No.: PCT/EP2017/082746
§ 371 (c)(1),
(2) Date: Jun. 17, 2019

(87) PCT Pub. No.: WO2018/109057
PCT Pub. Date: Jun. 21, 2018

(65) Prior Publication Data
US 2020/0124684 A1 Apr. 23, 2020

(30) Foreign Application Priority Data
Dec. 16, 2016 (EP) ..................................... 16204733

(51) Int. Cl.
*G01N 27/72* (2006.01)
*G01R 33/00* (2006.01)
(Continued)

(52) U.S. Cl.
CPC ....... *G01R 33/0005* (2013.01); *G01R 33/007* (2013.01); *G01R 33/0047* (2013.01); *G01R 33/07* (2013.01); *G01R 33/09* (2013.01)

(58) Field of Classification Search
CPC .............. G01R 33/0047; G01R 33/007; G01R 33/0005; G01R 33/025; G01R 33/07;
(Continued)

(56) References Cited

U.S. PATENT DOCUMENTS 7,265,430 B2 9/2007 Naito et al.
7,309,904 B2 12/2007 Naito et al.
(Continued)

FOREIGN PATENT DOCUMENTS

CN 1674270 A 9/2005
CN 104345204 A 2/2015
(Continued)

OTHER PUBLICATIONS

International Preliminary Report on Patentability from PCT Application No. PCT/EP2017/082746, dated Feb. 27, 2019.
(Continued)

*Primary Examiner* — Thang X Le
(74) *Attorney, Agent, or Firm* — Workman Nydegger

(57) ABSTRACT

An apparatus and a method for redundant measurements of a magnetic field originating from or influenced by a moveable object is described. The apparatus comprising at least one first magnetic field sensitive element measuring at least one magnetic field property of the magnetic field, wherein the at least one first magnetic field sensitive element is implemented on a first area of a semiconductor substrate, at least one second magnetic field sensitive element measuring at least one magnetic field property of the magnetic field, wherein the at least one second magnetic field sensitive element is implemented on a second area of said semiconductor substrate, and wherein the first and second areas are isolated from one another.

20 Claims, 4 Drawing Sheets

(51) Int. Cl.
*G01R 33/07* (2006.01)
*G01R 33/09* (2006.01)

(58) Field of Classification Search
CPC .... G01R 33/09; G01R 33/0206; G01R 33/06; G01R 33/063; G01R 33/093; G01R 33/0052; G01R 33/18
See application file for complete search history.

(56) References Cited

U.S. PATENT DOCUMENTS

| | | | | |
|---|---|---|---|---|
| 8,089,233 | B2* | 1/2012 | Kanekawa | G01D 5/14 318/400.38 |
| 8,102,175 | B2* | 1/2012 | Rossler | B82Y 25/00 324/252 |
| 8,564,282 | B2* | 10/2013 | Hoshiya | G01R 33/098 324/207.25 |
| 9,291,648 | B2 | 3/2016 | Snoeij et al. | |
| 9,618,589 | B2 | 4/2017 | Zimmer et al. | |
| 10,241,159 | B2 | 3/2019 | Vervaeke et al. | |
| 10,809,320 | B2* | 10/2020 | Mather | G01R 33/093 |
| 2005/0230827 | A1 | 10/2005 | Naito et al. | |
| 2006/0197168 | A1 | 9/2006 | Naito et al. | |
| 2007/0284684 | A1 | 12/2007 | Naito et al. | |
| 2008/0173961 | A1 | 7/2008 | Naito et al. | |
| 2012/0081109 | A1* | 4/2012 | Astegher | G01R 33/093 324/251 |
| 2014/0333314 | A1 | 11/2014 | Kaupp | |
| 2015/0042325 | A1 | 2/2015 | Snoeij et al. | |
| 2015/0108972 | A1 | 4/2015 | Zimmer et al. | |
| 2016/0202294 | A1 | 7/2016 | Snoeij et al. | |
| 2017/0123019 | A1 | 5/2017 | Vervaeke et al. | |

FOREIGN PATENT DOCUMENTS

| | | |
|---|---|---|
| CN | 104567950 A | 4/2015 |
| CN | 106233300 A | 12/2016 |
| DE | 10233080 A1 | 2/2004 |
| DE | 102010004830 A1 | 7/2011 |

OTHER PUBLICATIONS

International Search Report from PCT Application No. PCT/EP2017/082746, dated Jan. 24, 2018.

Extended European Search Report from EP Application No. 16204733.6, dated May 22, 2017.

Office Action from corresponding CN Application No. 201780077959.7, dated Mar. 2, 2021.

* cited by examiner

MAGNETIC SENSOR

TECHNICAL FIELD

The current application concerns an apparatus and a method for redundant magnetic field measurements, in particular of a magnetic field originating from or being influenced by a moveable object.

BACKGROUND

Apparatuses for measuring a magnetic field property of a magnetic field are often referred to as magnetic field sensors or magnetic sensors. These kinds of sensors have a broad field of use. Often times these kinds of sensors are used in combination with magnetized objects or objects which influence a magnetic field in one way or another, such that from the measurement of the magnetic field caused by these objects or the changes in the magnetic field caused by the influence of these objects, the position, the motion, and/or the orientation of the objects relative to the magnetic sensors can be determined.

The most common magnetic sensors are thereby linear and angular magnetic sensors. A linear magnetic sensor determines the linear motion of such an object in the vicinity of the magnetic sensor, as such the position of the object on a linear path relative to the magnetic sensor, whereas an angular magnetic sensor determines the angular orientation of such an object in the vicinity of the magnetic field sensor. Thereby, in both types of magnetic sensors, magnetic field sensitive elements measure at least one property of the magnetic field either emanated by the object, i.e. originating from the object itself, or influenced by the object and by processing or combining the measurements taken by the magnetic field sensitive elements, the linear motion or the angular orientation of the object can be determined. The magnetic sensors can also be adapted to determine both the linear motion as well as the angular position. Both types of magnetic sensors have in common that they generate at least one signal as a function of the applied magnetic field, wherein the at least one signal is dependent upon the measurements taken by the magnetic field sensitive elements. It can also be said that the at least one signal outputted by the magnetic sensors represents the measured at least one magnetic field property.

The known magnetic sensors often are used to determine the local variation of a magnetic field property. This local variation is often referred to as the gradient and is determined by forming the difference of two individually measured magnetic field properties. For example, two magnetic field properties which are measured by two magnetic field sensitive elements of a magnetic sensor. Based on the gradient determination, the motion of the object can be determined. Furthermore, by using the gradient determination, the influence of magnetic stray fields, hence magnetic fields which emanate from objects other than the object for which its motion shall be determined, can be reduced or even eliminated. This is due to the fact that stray fields typically influence the at least two magnetic field sensitive elements alike, such that when the difference is formed this influence is reduced or even eliminated.

In the automotive industry, the magnetic sensors are often used in highly safety relevant applications or safety relevant systems, which require a very high functional reliability. In order to fulfill these high reliability requirements, often two or more magnetic sensors of the same type or the same kind are placed close to each other, such that the magnetic field sensitive elements of the two or more magnetic sensors measure the same magnetic field property at approximately the same location. Hence, the two or more magnetic sensors output similar signals. In this case, it can be said that a redundant measurement is performed, since the same magnetic field property at approximately the same location is measured by the magnetic field sensitive elements of the two or more magnetic sensors. Hence, the two or more magnetic sensors form one redundant magnetic sensor.

An example of a redundant magnetic sensor is described in DE 10 2010 004 830 A1. The redundant magnetic sensor comprises two magnetic field sensitive elements. The two magnetic field sensitive elements are capable of outputting a signal which strength or value is proportional to the magnetic field property influencing the magnetic field sensitive elements. For example, if the magnetic field sensitive elements are Hall sensing elements, then these magnetic field sensitive elements output a voltage, which is proportional to the magnetic field property influencing the Hall sensing elements. In DE 10 2010 004 830 A1, the two magnetic field sensitive elements are placed on two opposing sides of one circuit board, so that they are capable of measuring the similar magnetic field property of a magnet rotating over the two magnetic field sensitive elements, but with a slight different distance to the magnet. A very similar configuration of two magnetic field sensitive elements is also described in DE 102 33 080 A1. By ease of two magnetic field sensitive elements, it is as such possible to measure the magnetic field property redundantly at nearly the same location.

In US 2012/0081109 A1 various embodiments of such redundant magnetic sensors are described. Thereby, in one embodiment a first Hall sensing element on a top side of a first semiconductor substrate and a second Hall sensing element on a top side of a second semiconductor substrate are placed adjacent to each other on a circuit board. These Hall sensing elements measure the same magnetic field property of a magnet moving in the vicinity of the Hall sensing elements. Also, an embodiment is described in which the two Hall sensing elements are arranged on the topside and the underside of a circuit board.

However, the known redundant magnetic sensors have the problem of not measuring exactly the same magnetic field properties because they are distal from each other and/or their exact relative position to each other is not accurately provided or known. This may be caused by assembly tolerances from the manufacturing process, in particular in the step in which the at least two magnetic field sensitive elements or the magnetic sensors forming the redundant magnetic sensor themselves are aligned and placed on the circuit board. Furthermore, a local displacement may also occur later in the lifetime of the redundant magnetic sensor, due to thermal expansion, expansion by humidity absorption or by material ageing processes. in particular accelerated when the redundant magnetic sensor is exposed to harsh environmental conditions as it is the case in the automotive industry.

Furthermore, due to the manufacturing tolerances, there will always be a small gap between the magnetic sensors respectively the magnetic field sensitive elements of a redundant magnetic sensor, when they are placed close to each other during manufacturing. As further the magnetic sensors or the magnetic field sensitive elements are apart from each other, the vaguer the redundant measurement. The vagueness can be mathematically compensated, however as further the magnetic sensors respectively the magnetic field sensitive elements are apart from each other as more complex the necessary mathematically compensations.

Hence, the objective technical problem of the current application is to overcome the disadvantages of the known prior art and provide improved redundant measurements.

SUMMARY

This problem is solved by the apparatus and method according to the independent claims of the current application.

An apparatus according to the invention can also be referred to as magnetic sensor. The apparatus according to the invention is for redundant measurements of a magnetic field. The measurements taken can actually be used, for example, to determine a linear position or an angular orientation of an object producing or influencing the magnetic field to be measured.

The magnetic field to be measured may originate from a permanent magnetized object itself, for example from a magnet, or may originate from an electromagnetic coil, which is an electrical conductor such as a wire in the shape of a coil, spiral or helix which when an electric current passes through emanates a magnetic field. The apparatus can be adapted to measure the magnetic field or at least one magnetic field property of a magnetic field emanating from such an object, when it is in the vicinity of the apparatus. This measurement can be called a direct measurement, since the emanated magnetic field is directly measured.

The apparatus may also be adapted to measure the magnetic field distortion or at least the change of one magnetic field property, when an object made of a soft magnetic material is moved through a magnetic field. Soft magnetic materials are those materials that are easily magnetized and demagnetized. Such a soft magnetic material is able to influence the magnetic field originating from a magnet or an electromagnetic coil. This measurement can be called an indirect measurement, since not the emanated magnetic field is measured, but the changes caused by the soft magnetic material.

For measuring the magnetic field or at least one property of the magnetic field, the apparatus according to the invention comprises at least one first magnetic field sensitive element measuring at least one magnetic field property of the magnetic field as well as at least one second magnetic field sensitive element measuring at least one magnetic field property of the magnetic field. It can also be said that the apparatus comprises at least a first set of magnetic field sensitive elements and a second set of magnetic field sensitive elements. Thereby, the sets can be a single element set, for example, each set may only comprise one magnetic field sensitive element, or the sets may comprise more than one magnetic field sensitive element.

The at least two magnetic field sensitive elements measure the at least one magnetic field property at their respective locations. Thereby, according to the invention the at least one first magnetic field sensitive element is implemented on a first area of a semiconductor substrate and the at least one second magnetic field sensitive element is implemented on a second area of said semiconductor substrate, wherein the first and second areas are isolated from one another. Speaking in terms of sets of magnetic field sensitive elements, this means a first set of magnetic field sensitive elements is implemented on a first area of the semiconductor substrate and a second set is implemented on a second area of the semiconductor substrate, wherein the two areas are isolated from one another. Isolated in these terms means that the two areas are electrically isolated from one another. For example, the two areas may be implemented by using silicon-on-insulator technology, preventing an electrical current flow from one area to the other. If there are more magnetic field sensitive elements, they may also be implemented on additional areas of the same semiconductor substrate, wherein the areas may be isolated from one another. This allows to achieve more redundant measurements, either allowing higher redundancy or allowing to conclude further properties of the moving object deducted from the measured at least one magnetic field property.

Having the magnetic field sensitive elements on different areas but on the same semiconductor substrate allows to take at least two measurements of the at least one magnetic field property of the magnetic field in a redundant manner. Redundant in this case means that at least two measurements of the same or related magnetic field properties are measured at nearly the same location. Thereby, further processing or combinations of the redundant measurements can be performed.

For example, the at least one first magnetic field sensitive element can measure the at least one magnetic field property of the magnetic field. This measurement of the at least one first magnetic field sensitive element may result in at least one signal representative or indicative of the magnetic field property and may give an indication of the linear position and/or the angular orientation of the moving object. The at least one second magnetic field sensitive element can also perform a measurement of the at least one magnetic field property of the magnetic field, and also this measurement may result in at least one signal representative or indicative of the magnetic field property and may give an indication of the linear position and/or the angular orientation of the moving object. Hence, the first area on which the at least one first magnetic field sensitive element is implemented can output at least one signal and the second area on which the at least one second magnetic field sensitive element is implemented can output at least another signal, both of which are representative or indicative of the linear position and/or the angular orientation of the moving object and both of which represent a redundancy.

Speaking in terms of sets of magnetic field sensitive elements, the magnetic field sensitive elements of the first set can measure the at least one magnetic field property of the magnetic field, and the measurements combined of the first set of the magnetic field sensitive elements may result in at least one signal representative or indicative of the magnetic field property and may give an indication of the linear position and/or the angular orientation of the moving object. The second set of magnetic field sensitive elements can also perform measurements of the at least one magnetic field property of the magnetic field, and the measurements combined of the second set of the magnetic field sensitive elements may result in at least another signal representative or indicative of the magnetic field property and may give an indication of the linear position and/or the angular orientation of the moving object. Hence, the first area on which the first set of magnetic field sensitive elements is implemented can output at least one signal and the second area on which the second set of magnetic field sensitive elements is implemented can output at least another signal, both of which are representative or indicative of the linear position and/or the angular orientation of the moving object and both of which represent a redundancy.

The apparatus according to the invention exhibits the advantage that the magnetic field sensitive elements are positioned very accurately with respect to each other, since they are implemented on the same semiconductor substrate. As such, the distance and the angular position between the magnetic field sensitive elements is extremely well defined, which allows to enhance the accuracy of the determination of the linear or angular position of the moving object, in particular if mathematical interpolations or extrapolations of the measured values of the magnetic field sensitive elements are necessary. Furthermore, due to the implementation on the same semiconductor substrate also the magnetic field sensitive elements can be placed closer together namely nearly at the same location, which inherently improves the redundant measurement capabilities. Furthermore, having the magnetic sensitive elements on one semiconductor substrate also reduces the wiring effort and allows packaging to be smaller. Also, since the semiconductor substrate is a good thermal conductor, both areas are subject to the same temperature, reducing any differences arising from temperature effects.

Therefore, the apparatus according to the invention for the first time allows to combine the electrical isolation of different sets of magnetic field sensitive elements with the exact positioning on the same semiconductor chip and therefore to achieve improved redundant measurements.

In one embodiment, the apparatus may further comprise a determination unit for determining at least one magnetic field property of the magnetic field at a virtual location based on the at least one magnetic field property of the magnetic field measured in the first area and/or the second area. Virtual in this case refers to a location in which it is not actually measured. The magnetic sensitive elements can only measure the at least one magnetic field property at the location they are implemented on the semiconductor substrate. However, for true redundant measurements, the at least one magnetic field property would need to be measured at the tantamount location individually by the at least two magnetic field sensitive elements. Therefore, the magnetic field sensitive elements would need to be at the tantamount location. Since this is physically not possible, at least one measurement taken by the at least first or the at least second magnetic field sensitive element has to be altered or shifted in a way as it would have been taken at another location, namely the virtual location. The determination unit thereby is adapted to be able perform the measurement shift from the actual location to the virtual location, for example by mathematically interpolating or extrapolating the measured at least one magnetic field property. Thereby, the magnetic field property to be determined at the virtual location can either be determined only based on one or more measurements taken from magnetic field sensitive elements implemented on one area of the semiconductor substrate or based on one or more measurements taken from magnetic field sensitive elements. It is also contemplated that the determination unit is adapted to shift the measurements of all or a portion of the magnetic field sensitive elements to virtual locations. Hence, in other words, since the magnetic field sensitive elements of the sets of magnetic field sensitive elements cannot be positioned at exactly the same location as they must be isolated from one another, the measured values within each set may be combined to represent an interpolation or extrapolation to a virtual location which is common to all sets.

Speaking in terms of only two magnetic field sensitive elements, the virtual location for the second magnetic field sensitive element can, for example, be determined to be at the real location of the at least one first magnetic field sensitive element. In this case, the first magnetic field sensitive element measures the actual at least one magnetic field property at its actual location and the at least one second magnetic field sensitive element measures the at least one magnetic field property at its actual location, however, the latter measurement is shifted by the determining unit to represent a value of the magnetic field property at the virtual location, namely the location of the at least one first magnetic field sensitive element. As such, a redundant measurement of the at least one magnetic field property is given. Thereby, one measurement is a real one taken at the actual real location, whereas the other is a virtual one, which is shifted, for example by ease of interpolation from or extrapolation to the actual real location. In general, from any measurement, it can be interpolated or extrapolated to any arbitrary virtual location as long as the characteristics of the magnetic field to be measured is known.

The determination unit can thereby be adapted to perform the determination of the at least one magnetic field property of the magnetic field at the virtual location in a first time instance based on the at least one magnetic field property of the magnetic field measured in the first area and in a second time instance based on the at least one magnetic field property of the magnetic field measured in the second area. Thereby, the time instances can be the same or different. In case the time instances are the same, the determination is made in parallel, whereas if the time instances are different the determination is made sequentially.

The determination unit can also be adapted to compare at least one magnetic field property of the magnetic field at the virtual location determined based on the at least one magnetic field property of the magnetic field measured in the first area with at least one magnetic field property of the magnetic field at the virtual location determined based on the at least one magnetic field property of the magnetic field measured in the second area. In addition, or alternatively, the determination unit can be adapted to provide at least one magnetic field property of the magnetic field at the virtual location determined based on the at least one magnetic field property of the magnetic field measured in the first area and/or at least one magnetic field property of the magnetic field at the virtual location determined based on the at least one magnetic field property of the magnetic field measured in the second area. This provision can, for example, be to an outer host system, which than can perform the processing with the respective determinations.

Although the determination unit is described in terms of discrete measurements taken by a first magnetic field sensitive element and a second magnetic field sensitive element, it is clear to a person skilled in the art that also sets of magnetic field sensitive elements are contemplated by the invention. As such, the determination unit can also be adapted to determine the at least one magnetic field property at a virtual location for more than one magnetic field sensitive element, either individually or as a combination of individual measurements.

The determination unit can thereby be implemented as an IC, ASIC, FPGA or any other logic which is able to perform the required processing or combination of outputs of the magnetic field sensitive elements. Thereby, the processing of the outputs can be performed by active electronic components, whereas the simple combination of the outputs can be performed by hardwiring or passive electronic components.

In one further embodiment, the at least two areas on which the magnetic field sensitive elements are implemented comprise contacts for connecting the areas separately to the determination unit. Via these contacts signals can be propagated, which represent or are indicative to the magnetic field property measured by the magnetic field sensitive elements.

These signals can be used by the determination unit to determine the at least one magnetic field property at the virtual location and/or compare the signals from the actual measurements with the ones determined for the virtual location. The contacts can also be used to supply the respective magnetic field sensitive elements with power.

In one further embodiment, the at least one first magnetic field sensitive element and the at least one second magnetic field sensitive element are arranged in opposed pairs. This means a straight line can be drawn between at least one first magnetic field sensitive element and at least one second magnetic field sensitive element and the respective magnetic field sensitive elements are arranged at opposing ends of this straight line. Furthermore, it is also contemplated that the at least one first magnetic field sensitive element is arranged with a first distance to a common center point and the at least one second magnetic field sensitive element is arranged with a second distance to the common center point. Thereby, the first and second distances may be the same or different. Also, the distances may vary for each magnetic field sensitive element individually. A person skilled in the art will contemplate that arbitrary arrangements of the magnetic field sensitive elements are possible and that they are best arranged according to the implementation.

In one further embodiment, the at least one first magnetic field sensitive element and the at least one second magnetic field sensitive element are Hall sensing elements or magnetoresistance sensing elements. As Hall sensing elements, horizontal Hall sensing elements or vertical Hall sensing elements may be used. Thereby, horizontal Hall sensing elements are responsive to the magnetic field components perpendicular to the semiconductor substrate, whereas vertical Hall sensing elements are responsive to magnetic field components parallel to the semiconductor substrate. By using one or several magnetic concentrators, the horizontal Hall sensing elements can also be made responsive to magnetic field components parallel to the semiconductor substrate, since magnetic concentrators are capable of redirecting the magnetic field to be measured. As magnetoresistance sensing elements, for example, also Anisotropic Magneto Resistance (AMR), Giant Magneto Resistance (GMR), or Tunneling Magneto Resistance (TMR) can be used. It shall also be contemplated that a combination of different magnetic field sensitive elements can be used.

In one further embodiment, the at least one first magnetic field sensitive element and the at least one second magnetic field sensitive element measure the same magnetic field property of the magnetic field. At any given point a magnetic field is specified by both a direction and a strength, as such it is a vector field, wherein the magnetic field property may be the direction or strength of the vector field or a component of the vector field. A magnetic field property may as such be the strength of the magnetic field along a certain direction, for example, along the coordinate axes of a Cartesian, cylindrical or spherical coordinate system or along any direction described by a combination of those coordinates. Using a Cartesian coordinate system as reference, the vector field can at any given point be expressed by the three components of the magnetic field, namely Bx, By, and Bz. The magnetic field sensitive elements can measure one of these components or a combination of the components and output a signal. The magnetic field sensitive elements as such can be able to measure the magnetic field strength parallel or perpendicular to a surface of the semiconductor substrate. Also, the magnetic field sensitive elements may measure the radial or tangential component of a magnetic field. This may be possible by arranging the magnetic sensitive elements with the angle of incidence of the magnetic field lines of the magnetic field onto the semiconductor substrate.

It is also encompassed by the invention that measurements taken by magnetic field sensitive elements in one area of the semiconductor substrate can be combined to represent or to be indicative of a specific property of the magnetic field which lets to interfere a property of the moving object, i.e. which can be used to determine a property of the moving object, and that this magnetic field property resulting from a combination can also be determined from the magnetic field sensitive elements in the second area. For example, a gradient can be determined by forming differences of the different sets of magnetic field sensitive elements measurements or even within a set of magnetic field sensitive elements, wherein the gradient can be indicative of the motion of the object.

The above-mentioned objective technical problem is also solved by a method for redundant measurements of a magnetic field originating from a magnetized object or influenced by an object. The method comprising measuring at least one magnetic field property of the magnetic field with at least one first magnetic field sensitive element and measuring at least one magnetic field property of the magnetic field with at least one second magnetic field sensitive element. The at least one first and at least one second of magnetic field sensitive elements are thereby implemented on a same semiconductor substrate, but on different isolated areas of the semiconductor substrate.

In one embodiment, the method may further comprise determining at least one magnetic field property of the magnetic field at a virtual location based on the at least one magnetic field property of the magnetic field measured in the first area and/or the second area. Also, the method may comprise comparing at least one magnetic field property of the magnetic field at the virtual location determined based on the at least one magnetic field property of the magnetic field measured in the first area with at least one magnetic field property of the magnetic field at the virtual location determined based on the at least one magnetic field property of the magnetic field measured in the second area.

BRIEF DESCRIPTION OF THE DRAWINGS

The following description and the annexed drawings set forth in detail certain illustrative aspects of the apparatus and method described above. These aspects are indicative, however, of but a few of the various ways in which the principles of various embodiments can be employed and the described embodiments are intended to include all such aspects and their equivalent.

In the drawings, like reference characters generally refer to the same parts throughout the different drawings. The drawings are not necessarily to scale, emphasis instead generally being placed upon illustrating the principles of the invention.

Figure 1:
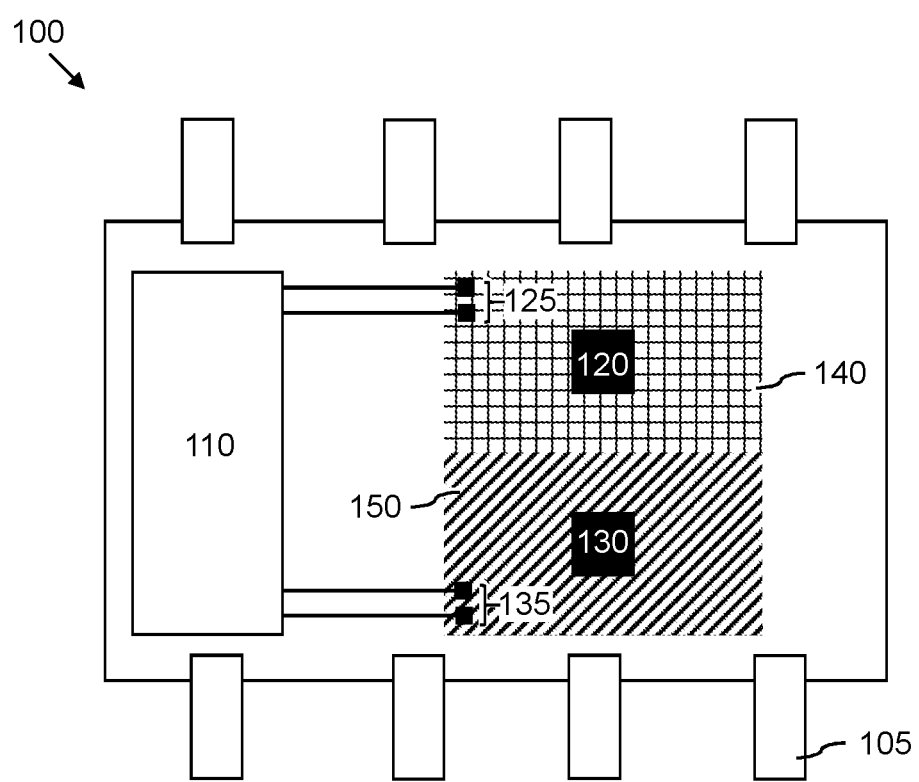
Figure 2A:
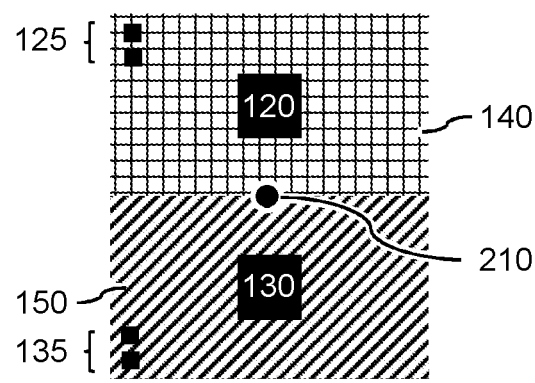
Figure 3:
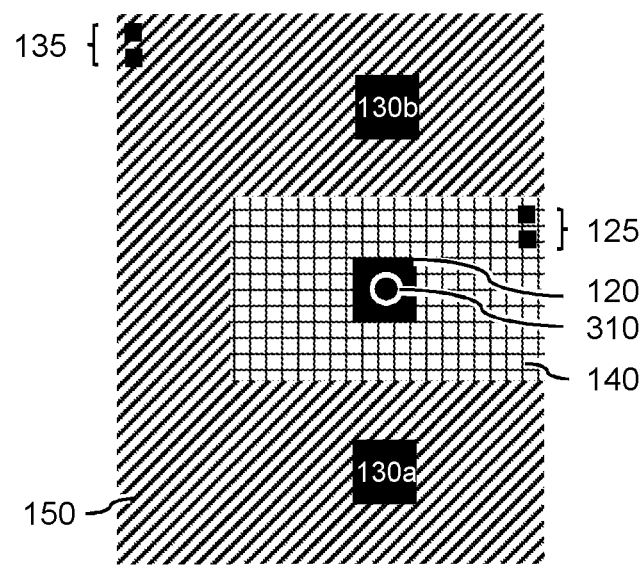
Figure 4:
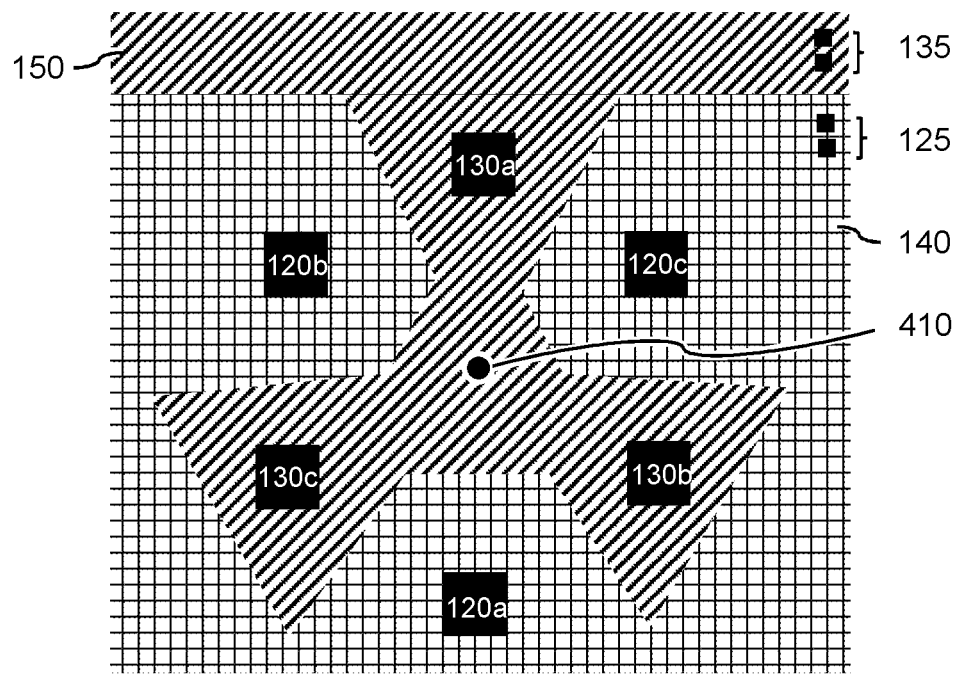
Figure 5:
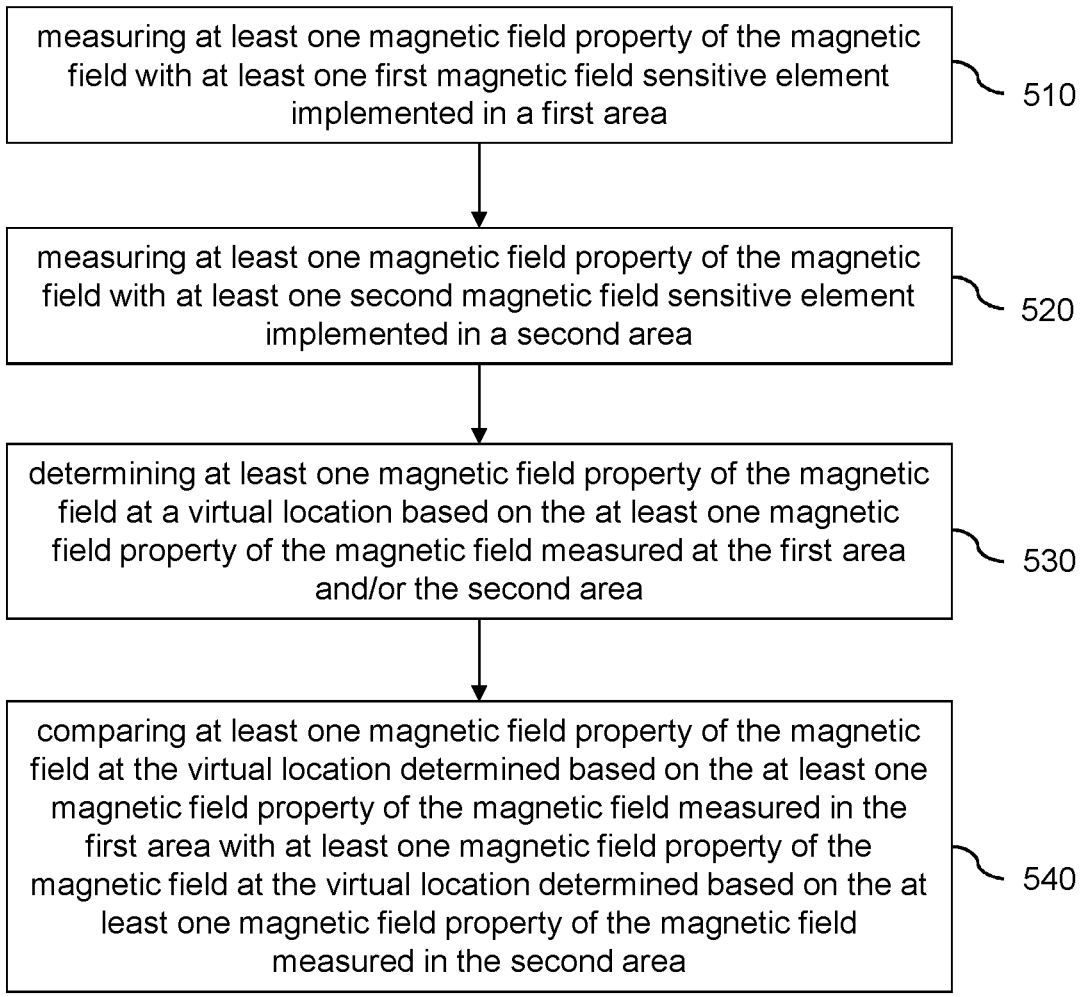

In the following description, various embodiments of the invention are described with reference to the following drawings, in which:

FIG. 1 shows a plan view of a magnetic sensor chip according to one embodiment example of the invention;

FIG. 2a, b, c shows a plan view of the semiconductor substrate of the magnetic sensor chip according to FIG. 1, with different redundant measurement locations;

FIG. 3 shows a plan view of a semiconductor substrate of a magnetic sensor chip according to another embodiment example of the invention, with one redundant measurement location;

FIG. 4 shows a plan view of a semiconductor substrate of a magnetic sensor chip according to another embodiment example of the invention, with one redundant measurement location; and FIG. 5 shows a flow diagram of a method according to the invention to provide redundant measurements.

DETAILED DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

FIG. 1 shows a plan view of a magnetic sensor chip 100 according to one embodiment example of the invention. The magnetic sensor chip 100 can also be referred to as one magnetic sensor. The magnetic sensor chip 100 comprises at least two magnetic field sensitive elements 120 and 130, which are implemented on the same semiconductor material, but in different areas 140, 150. Even so the magnetic field sensitive elements 120 and 130 are here depicted as discrete single elements, it shall be contemplated that these sensitive elements 120 and 130 can also be made out of several magnetic field sensitive elements. As such, it can also be said that the magnetic field sensitive elements 120 and 130 are sets of magnetic field sensitive elements. Therefore, each magnetic field sensitive element 120 and 130 as indicated by a black square may be realized by one magnetic field sensitive element or a set of magnetic field sensitive elements comprising one or more magnetic field sensitive elements.

The two magnetic field sensitive elements 120 and 130 as depicted in FIG. 1 are implemented on different areas 140 and 150 of the semiconductor substrate. The different areas are indicated with the different patterns and are referred to as area 140 and area 150. The two areas 140, 150 are implanted on the same semiconductor substrate but are isolated from each other. Thereby, the two areas 140, 150 may be isolated by using the silicon on insulator technology, which refers to the use of a layered silicon—insulator—silicon substrate in place of conventional silicon substrates in semiconductor manufacturing.

In the here shown embodiment example, the areas 140 and 150 also possess contacts 125 and 135, respectively. Via these contacts 125, 135 signals from the magnetic field sensitive elements 120 and 130 can be propagated to an optional determination unit 110. Furthermore, the contacts 125 and 135 can be used to provide the magnetic field sensitive elements 120 and 130 with power necessary to perform the measurement of the magnetic field property.

A person skilled in the art will contemplate that even so in the here shown embodiment example the determination unit 110 is part of the magnetic sensor chip 100, this is only for illustrative purposes and the determination unit 110 can also be external to the actual magnetic sensor chip 100 or can be absent all together.

The magnetic sensor chip 100 may also comprise contacts 105, with which the magnetic sensor chip 100 can be connected to circuit boards and with which signals can be inputted and outputted from and to the magnetic sensor chip 100. Thereby, the contacts 105 can either be connected to the determination unit 110, or if the determination unit 110 is absent the contacts 105 can be connected to the contacts 125 and 135.

Figure 2B:
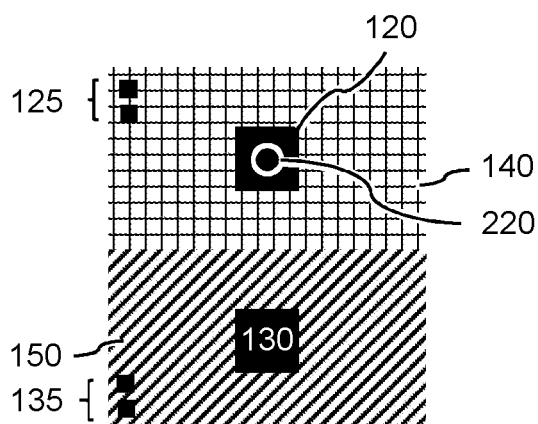
Figure 2C:
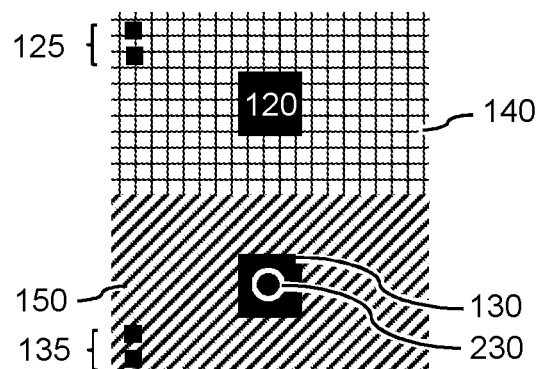

FIGS. 2a, 2b, and 2c show a plan view of the semiconductor substrate of the magnetic sensor chip 100 according to FIG. 1. In the here shown FIGS. 2a, 2b, and 2c, it is however illustrated how the measurements of the two magnetic field sensitive elements 120 and 130 can be used to determine at least one magnetic field property of the magnetic field by using a virtual location.

In FIG. 2a, the virtual location 210 is indicated by a round circle and is located in the middle of the two areas 140 and 150, namely in the middle of the connecting line between the two magnetic field sensitive elements 120 and 130. In order to achieve a redundant magnetic field property determination at this virtual location 210, the measurements taken from the magnetic field sensitive element 120 and magnetic field sensitive element 130 have both to be mathematically altered, for example, interpolated or extrapolated, in order to represent the magnetic field property at the virtual location.

However, the virtual location can also be selected to coincide with a location of either of the two magnetic field sensitive elements 120 or 130 as shown in FIGS. 2b and 2c for the virtual locations 220 and 230.

In FIG. 2b, the virtual location 220 coincides with the actual location of magnetic field sensitive element 120. As such, magnetic field sensitive element 120 can measure the at least one magnetic field property at the location it is actually located and the measurements taken by magnetic field sensitive element 130 can be mathematically altered, for example interpolated or extrapolated, to the virtual location 220. As such a redundant measurement of one location is given, namely one measurement taken at the actual location and one interpolated or extrapolated from a measurement actually taken at another location.

A similar situation is shown in FIG. 2c, in which the virtual location 230 is positioned at the location of magnetic field sensitive element 130. As such, the actual measurement at this location is taken by magnetic field sensitive element 130, whereas the measurement taken by magnetic field sensitive element 120 is mathematically altered, for example interpolated or extrapolated, to the virtual location 230.

The mathematical alterations as used in FIGS. 2a, 2b and 2c require the knowledge of the magnetic field to be measured and may be quite complex depending on the magnetic field topology.

However, when more magnetic field sensitive elements are used, the complexity of the calculations to be performed can be reduced.

One example of such a reduction in complexity by using more magnetic field sensitive elements is shown in FIG. 3. In FIG. 3, one first magnetic field sensitive element 120 is shown, which is implemented on a first area 140 of the semiconductor substrate. Furthermore, FIG. 3 shows two second magnetic field sensitive elements 130a and 130b which are implemented on a second area 150 on the same semiconductor substrate. The first magnetic field sensitive element 120 is arranged as such that its location is in the middle of the connecting line between the two second magnetic field sensitive elements 130a and 130b. As such, if the virtual location 310 is selected to be at the location of the first magnetic field sensitive element 120, the first magnetic field sensitive element 120 can measure the actual magnetic field property at this location, whereas from the measurements taken by the two second magnetic field sensitive elements 130a and 130b the magnetic field property at the virtual location 310 can be determined, for example by forming the arithmetic average between the two measurements of the two second magnetic field sensitive elements 130a and 130b. The complexity to calculate the arithmetic average is quite low compared to performing interpolations or extrapolations. Furthermore, since the magnetic field sensitive elements 130a and 130b output signals which represent or are indicative to the measured magnetic field property, it is also possible to form the average by wiring the signals together, with or without further logic. This combination without processing may be referred to as hardwiring, since this average forming can be performed by simple wiring or passive electronic logic components.

A person skilled in the art will contemplate that a plurality of combinations of pairs of magnetic field sensitive elements are possible to redundantly determine a magnetic field property at a virtual location.

The pairs for the combination also do not need to be on the same area of the semiconductor substrate. A magnetic field property at a virtual location can also be determined using alternating pairs of magnetic field sensitive elements implemented on the first and second area of the semiconductor substrate, respectively.

This is for example shown in FIG. 4, which shows a first area 140 with magnetic field sensitive elements 120a, 120b, and 120c and a second area 150 with magnetic field sensitive elements 130a, 130b, and 130c. The magnetic field sensitive elements 120a, b, c and 130a, b, c are located in this example in an equal distance to a center point, which coincides with a virtual location 410. Furthermore, the first magnetic field sensitive elements 120a, b, c and the second magnetic field sensitive elements 130a, b, c are arranged as such, that they are pairwise opposing each other. Thereby, the magnetic field sensitive elements can form three alternating pairs namely 120a-130a, 120b-130b, and 120c-130c. Alternating thereby refers to that fact that the pairs are formed by one magnetic field sensitive element from the first area 140 and one magnetic field sensitive element from the second area 150. For each pair, the average of the actual measurements can be determined, in order to determine the magnetic field property at the virtual location 410.

However, also other combinations are possible. It is for example possible that the magnetic field sensitive elements 120a and 130a take actual measurements of the magnetic field property at their locations and these measurements are then interpolated or extrapolated to determine the magnetic field property at the virtual location 410 by both measurements taken. The same can then also be performed by the other magnetic field sensitive elements 120b, 130b and 120c, 130c.

However also other combinations of actual measurements taken by the respective magnetic field sensitive elements 120a, b, c and 130a, b, c are possible.

It is clear to a person skilled in the art that even so FIGS. 1 to 4 only encompass two distinct areas 140 and 150 in which magnetic field sensitive elements 120 and 130 are implemented, the invention is not limited to a configuration with only two areas 140 and 150 and may comprise also more areas in which magnetic field sensitive elements 120 and 130 can be implemented. Furthermore, the aforementioned embodiment examples of determining the magnetic field property at a virtual location are not limited to the ones described. A person skilled in the art will recognize that depending on the arrangement of the magnetic field sensitive elements 120 and 130 on the semiconductor substrate, various determinations of a magnetic field property at a virtual location or even virtual locations are possible, by combining, interpolation and/or extrapolating the measurements taken at actual positions by a magnetic field sensitive element. The arrangement of magnetic field sensitive elements 120 and 130 as shown in FIG. 4 can for example be used to determine similar but not identical sets of three phase measurements from the magnetic field sensitive elements 120 and 130, respectively, for example for a motor commutation. Thereby, the measurements taken within one set of magnetic field sensitive elements are offset by 120 degrees.

Furthermore, even if not shown in the Figures, also magnetic field concentrators can be used, for example, on top of the magnetic field sensitive elements 120 and 130, which direct the components of the magnetic field through the magnetic field sensitive elements. Thereby, magnetic field components can be made useable, which otherwise may not be measurable by the magnetic field sensitive elements. This in turn allows also to even further reduce the package size.

FIG. 5 shows in a flow diagram the steps of a method for redundant measurements of at least one magnetic field property of a magnetic field. In step 510, at least one magnetic field property of a magnetic field is measured with at least one first magnetic field sensitive element. Thereby, the at least one first magnetic field sensitive element is implemented in a first area of a semiconductor substrate. In step 520, at least one magnetic field property of the magnetic field is measured with at least one second magnetic field sensitive element. Thereby, the at least one second magnetic field sensitive element is implemented in a second area of the semiconductor substrate. Based on one or both of the measurements taken in steps 510 and 520 at least one magnetic field property at a virtual location may be determined in step 530. It can also be said the magnetic field property is calculated at the virtual location based on both or one of the measurements taken in steps 510 and 520. This may result in two determinations of a magnetic field property of the magnetic field, ones determined from the measurements taken by the magnetic field sensitive elements in the first area and ones determined from the magnetic field sensitive elements in the second area.

Optionally, the method may also comprise the step of comparing at least one magnetic field property of the magnetic field at the virtual location determined based on the at least one magnetic field property of the magnetic field measured in the first area with at least one magnetic field property of the magnetic field at the virtual location determined based in the at least one magnetic field property of the magnetic field measured in the second area.

What has been described above includes examples of one or more embodiments. It is, of course, not possible to describe every conceivable combination of components or methodologies for purposes of describing the aforementioned embodiments, but one of ordinary skill in the art may recognize that many further combinations and permutations of various embodiments are possible. Accordingly, the described embodiments are intended to embrace all such alterations, modifications and variations that fall within the spirit and scope of the appended claims.

The invention claimed is:

1. An apparatus for redundant measurements of a magnetic field originating from or influenced by a moveable object, the apparatus comprising:
first magnetic field sensitive elements including at least three first magnetic field sensitive elements configured to measure at least a first magnetic field property of the magnetic field, wherein the first magnetic field sensitive elements are implemented on a first area of a semiconductor substrate;

second magnetic field sensitive elements including at least three second magnetic field sensitive elements configured to measure at least a second magnetic field property of the magnetic field, wherein the second magnetic field sensitive elements are implemented on a second area of said semiconductor substrate;

wherein the first magnetic field sensitive elements and the second magnetic field sensitive elements are arranged to form at least three alternating pairs pairwise opposing each other; and wherein the first area and the second area are isolated from one another.

2. The apparatus of claim 1, further comprising:

a determination unit for determining at least one magnetic field property of the magnetic field at a virtual location based on the first magnetic field property of the magnetic field measured in the first area and/or the second magnetic field property of the magnetic field measured in the second area.

3. The apparatus of claim 2, wherein the determination unit is adapted to perform the determination of the at least one magnetic field property of the magnetic field at the virtual location in a first time instance based on the first magnetic field property of the magnetic field measured in the first area and in a second time instance based on the second magnetic field property of the magnetic field measured in the second area.

4. The apparatus of claim 2, wherein the determination unit is adapted to compare the at least one magnetic field property of the magnetic field at the virtual location determined based on the first magnetic field property of the magnetic field measured in the first area with the at least one magnetic field property of the magnetic field at the virtual location determined based on the second magnetic field property of the magnetic field measured in the second area.

5. The apparatus of claim 2, wherein the determination unit is adapted to provide the at least one magnetic field property of the magnetic field at the virtual location determined based on the first magnetic field property of the magnetic field measured in the first area and/or at least one magnetic field property of the magnetic field at the virtual location determined based on the second magnetic field property of the magnetic field measured in the second area.

6. The apparatus of claim 2, wherein each of the first area and the second area comprises contacts for connecting each of the first area and the second area separately to the determination unit.

7. The apparatus of claim 1, wherein the at least three first magnetic field sensitive elements and the at least three second magnetic field sensitive elements are arranged in opposed pairs.

8. The apparatus of claim 1, wherein the at least three first magnetic field sensitive elements are arranged with a first distance to a common center point and the at least three second magnetic field sensitive elements are arranged with a second distance to the common center point.

9. The apparatus of claim 1, wherein the first magnetic field sensitive elements and the second magnetic field sensitive elements are equal in number.

10. The apparatus of claim 1, wherein the first magnetic field sensitive elements and the second magnetic field sensitive elements include Hall sensing elements or magnetoresistance sensing elements.

11. The apparatus of claim 1, wherein the first magnetic field property measured by the first magnetic field sensitive elements and the second magnetic field property measured by the second magnetic field sensitive elements are the same magnetic field property of the magnetic field.

12. The apparatus of claim 11, wherein the measured magnetic field property is the magnetic field strength parallel to a surface of the semiconductor substrate.

13. The apparatus of claim 11, wherein the measured magnetic field property is the magnetic field strength perpendicular to a surface of the semiconductor substrate.

14. The apparatus of claim 1, wherein each of the first magnetic field sensitive elements and each of the second magnetic field sensitive elements are arranged in opposed pairs.

15. A method for redundant measurements of a magnetic field originating from or influenced by a moveable object with an apparatus, the method comprising:

measuring at least a first magnetic field property of the magnetic field with first magnetic field sensitive elements including at least three first magnetic field sensitive elements, the first magnetic sensitive elements being implemented on a first area of a semiconductor substrate;

measuring at least a second magnetic field property of the magnetic field with second magnetic field sensitive elements including at least three second magnetic field sensitive elements, the second magnetic sensitive elements being implemented on a second area of the semiconductor substrate;

wherein the first magnetic field sensitive elements and the second magnetic field sensitive elements are arranged to form at least three alternating pairs pairwise opposing each other; and wherein the first area and the second area are different from one another on the same semiconductor substrate and the first area and the second area are isolated from one another.

16. The method of claim 15, further comprising:

determining at least one magnetic field property of the magnetic field at a virtual location based on the first magnetic field property of the magnetic field measured in the first area and/or the second magnetic field property of the magnetic field measured in the second area.

17. The method of claim 16, further comprising:

comparing at least one magnetic field property of the magnetic field at the virtual location determined based on the first magnetic field property of the magnetic field measured in the first area with at least one magnetic field property of the magnetic field at the virtual location determined based on the second magnetic field property of the magnetic field measured in the second area.

18. The method of claim 15, wherein the first magnetic field property measured by the first magnetic field sensitive elements and the second magnetic field property measured by the second magnetic field sensitive elements are the same magnetic field property of the magnetic field.

19. The method of claim 18, wherein the measured magnetic field property is the magnetic field strength parallel to a surface of the semiconductor substrate.

20. The method of claim 18, wherein the measured magnetic field property is the magnetic field strength perpendicular to a surface of the semiconductor substrate.

* * * * *